(12) United States Patent
Antoniou et al.

(10) Patent No.: US 9,859,360 B2
(45) Date of Patent: Jan. 2, 2018

(54) EDGE TERMINATION FOR SEMICONDUCTOR DEVICES AND CORRESPONDING FABRICATION METHOD

(71) Applicant: ABB Schweiz AG, Baden (CH)

(72) Inventors: Marina Antoniou, Cambridge (GB); Florin Udrea, Cambridge (GB); Iulian Nistor, Niederweningen (CH); Munaf Rahimo, Uezwil (CH); Chiara Corvasce, Bergdietikon (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/184,261

(22) Filed: Jun. 16, 2016

(65) Prior Publication Data
US 2016/0300904 A1    Oct. 13, 2016

Related U.S. Application Data

(63) Continuation of application No. PCT/EP2014/076443, filed on Dec. 3, 2014.

(30) Foreign Application Priority Data

Dec. 16, 2013    (EP) .................................... 13197534

(51) Int. Cl.
*H01L 29/66*    (2006.01)
*H01L 29/06*    (2006.01)
(Continued)

(52) U.S. Cl.
CPC ...... *H01L 29/0619* (2013.01); *H01L 29/0623* (2013.01); *H01L 29/0661* (2013.01);
(Continued)

(58) Field of Classification Search
CPC ............ H01L 29/0619; H01L 29/0696; H01L 29/66348; H01L 29/66712;
(Continued)

(56) References Cited

U.S. PATENT DOCUMENTS 8,080,858 B2 * 12/2011 Hirler ................. H01L 29/0623
257/329
8,680,613 B2 *  3/2014 Guan .................... H01L 29/407
257/330
(Continued)

FOREIGN PATENT DOCUMENTS

WO    2014048046 A1    4/2014

OTHER PUBLICATIONS

International Search Report and Written Opinion, PCT/EP2014/076443, ABB Technology AG, dated Jan. 12, 2015, 10 pages.
(Continued)

*Primary Examiner* — Vu A Vu
(74) *Attorney, Agent, or Firm* — Taft Stettinius & Hollister LLP

(57) ABSTRACT

A termination region of an IGBT is described, in which surface p-rings are combined with oxide/polysilicon-filled trenches, buried p-rings and surface field plates, so as to obtain an improved distribution of potential field lines in the termination region. The combination of surface ring termination and deep ring termination offers a significant reduction in the amount silicon area which is required for the termination region.

17 Claims, 4 Drawing Sheets

(51) Int. Cl.
*H01L 29/40* (2006.01)
*H01L 29/739* (2006.01)
*H01L 29/78* (2006.01)

(52) U.S. Cl.
CPC ........ *H01L 29/0696* (2013.01); *H01L 29/404* (2013.01); *H01L 29/66333* (2013.01); *H01L 29/66348* (2013.01); *H01L 29/66712* (2013.01); *H01L 29/66734* (2013.01); *H01L 29/7395* (2013.01); *H01L 29/7397* (2013.01); *H01L 29/7811* (2013.01); *H01L 29/7813* (2013.01)

(58) Field of Classification Search
CPC ........... H01L 29/66734; H01L 29/7395; H01L 29/66333; H01L 29/7811; H01L 29/7813; H01L 29/404; H01L 29/0623; H01L 29/0661; H01L 29/7397

USPC .................................................. 257/194, 139
See application file for complete search history.

(56) References Cited

U.S. PATENT DOCUMENTS

| 8,785,279 B2* | 7/2014 | Bhalla ................ H01L 29/0696 257/E21.419 |
| 2008/0042172 A1 | 2/2008 | Hirler et al. |
| 2009/0090968 A1 | 4/2009 | Ono et al. |

OTHER PUBLICATIONS

European Search Report, EP13197534.4, ABB Technology AG, dated Jun. 3, 2014, 8 pages.

Response to Written Opinion, EP13197534.4, ABB Technology AG, May 9, 2016, 2 pages.

\* cited by examiner

EDGE TERMINATION FOR SEMICONDUCTOR DEVICES AND CORRESPONDING FABRICATION METHOD

TECHNICAL FIELD

The present invention relates to termination arrangements for semiconductor devices and, in particular but not exclusively, to termination arrangements for high voltage (HV) semiconductor devices such as diodes, transistors or insulated gate bipolar transistors (IGBTs) which are required to withstand reverse voltages of hundreds or thousands of volts.

BACKGROUND OF THE INVENTION

A high voltage semiconductor device typically comprises a termination region which electrically isolates the device from the surrounding substrate and/or from the device's package. The termination region must ensure that the active area of the device is protected from high voltages, and that the device breakdown voltage of the device is as high as possible.

For high voltage devices such as DMOSFETs or IGBTs, a lightly doped drift region may be terminated in such a way as to ensure the optimum distribution of field or potential lines which is important to achieve the full voltage rating of the device. In order to be effective, such a termination area should preferably have a higher voltage-withstanding capability than the interior (active) area of the device.

Electrical termination can be achieved by dielectric materials or/and by reverse-biased pn-junctions. Under dielectric isolation, a dielectric insulator material such as an oxide of silicon may be used, in which case electrical termination may be achieved by forming oxide-filled trenches in the termination area surrounding the device's active area. Such termination trenches may be effective at distributing the potential or field lines laterally through the substrate body, but may leave the charge and potential distribution at the surface relatively uncontrolled.

Alternatively, a junction isolation termination may be used, in which reverse-biased p-n junctions help to achieve the required distribution of field or potential lines through the termination area. Surface guard-rings of opposite doping to the drift region may be used, for example, to distribute the potential across the termination area near the surface of the substrate. However, such termination arrangements are less effective at preventing crowding of the potential lines in the substrate body near the surface. Furthermore, such prior art termination arrangements typically either involve extra fabrication steps and/or masks, or the fabrication process may impose limitations on the geometries and/or configurations of the termination elements.

US 2008/042172 A1 refers to a prior art MOS transistor, which comprises trench gates in the active cell area and termination trench gates in the termination area, which are surrounded by one contiguous p doped layer.

In US 2009/090968 A1 a prior art MOS device is described having in the termination region p guard rings, which are covered by a field plate electrode.

SUMMARY OF THE INVENTION

An aim of the present invention is to overcome at least some of the disadvantages of prior art termination arrangements. To this end, the invention foresees a fabrication method as set out in claim 1 and a semiconductor device as set out in claim 6. Further variants of the invention are set out in the dependent claims 2 to 5 and 7 to 11.

By combining the fabrication of termination trenches and buried guard-rings with the fabrication of surface guard rings, it is possible to achieve a superior termination efficiency (ie reduced termination area and/or increased breakdown-voltage) while minimising the amount of additional fabrication processing required. The addition of field plates over the termination trenches and/or the surface guard rings may further improve the termination efficiency.

By having an arrangement of the termination trenches and deep lying buried guard rings, which abut the termination trenches, the electric field is kept at a high depth in the termination area up to such an buried termination trench so that the potential lines of the electric field are guided laterally outward from the active area, which increases the breakdown voltage. Due to the surface guard rings abutting the termination trenches on the side of the termination trenches towards the edge of the substrate the electric field is further spreaded outward from the active area, but still efficiently terminated before the next outwards lying termination trench, i.e. the electric field is terminated better controlled, but still within a short lateral distance.

It is important to have the drift layer abutting each termination trench on the side towards the active cell area and to have the surface guard rings being arranged only on the side towards the edge of the substrate so that the electric field is directed to terminate in the region beyond, i.e. outwards the termination trench (i.e. on the side towards the edge of the substrate). The presence of the surface guard ring on the side of the termination trench towards the active cell area would foil the effect of directing the potential lines away from the active cell area.

In an exemplary embodiment, the presence of the field plate connecting the termination trench with the surface guard ring contributes to the effect of terminating the electric field within a short, but controlled lateral distance from the active cell area and protects the surface of the substrate.

Thus the inventive semiconductor device enables to have a device with an efficient field termination within a small distance so that the device can be operated more reliable and can be designed more compact than prior art devices, i.e. the termination area (i.e. lateral extension of the termination area) can be reduced.

BRIEF DESCRIPTION OF THE DRAWINGS

The invention will now be described in more detail with reference to the accompanying drawings, in which.

It should be noted that the drawings are provided as an aid to understanding certain principles underlying the invention, and should not be taken as implying any limitation in the scope of protection sought. Where the same reference signs have been used in more than drawing, these are intended to refer to the same or corresponding features. However, the use of different reference signs should not be taken as indicating a difference between the features to which the signs refer.

DETAILED DESCRIPTION OF THE INVENTION

Figure 1:
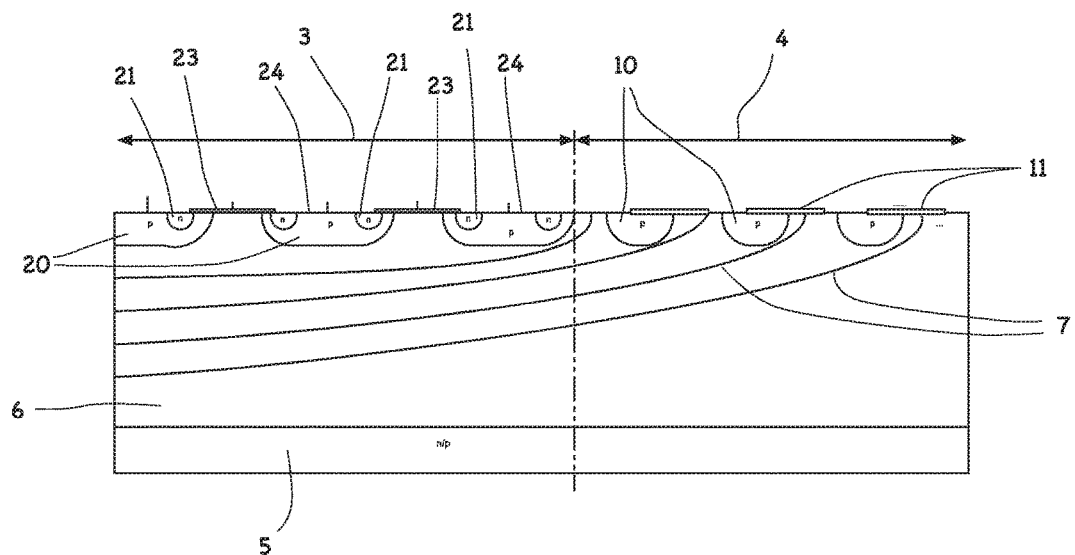
FIG. 1 shows, in schematic, cross-section view, an example of an n-channel DMOS device terminated using p-rings and field plates, as known in the prior art.

FIG. 1 shows an example of a cross-sectional view of an n-channel depletion MOSFET or IGBT as known in the prior art. The active cell area 3 comprises an array of power MOSFET or IGBT cells, each having a p-doped body region 20 (i.e. of the second conductivity type) surrounding two p-n junctions formed between the two n-doped regions 21 (i.e. of the first conductivity type) and the p-doped body (well) region 20. Two gate connections 23 (each shared with a neighbouring cell in this example case) are provided for controlling the current flow from the p-n junctions into the drift region 6, and through the device substrate 6 (in form of an n– drift layer) to the drain/cathode layer 5 (n-doped in the case of an n-channel DMOSFET, or p-doped in the case of an n-channel IGBT). Power is supplied to each device cell via an emitter/anode contact 24.

FIG. 1 also shows how the MOSFET or IGBT may be terminated using guard rings 10 and field-plates 11 distributed across edge-termination area 4. The potential lines 7 may be prevented from concentrating around the edge of the active area 3 by the inclusion of p-doped guard rings 10 formed in the surface of the substrate material. Each of the guard rings 10 forms a weakly-doped p-n junction between the lightly p-doped guard ring 10 and the lightly n-doped drift region 6 and, under reverse-biased conditions, serves to reduce the amount of electric field crowding at the substrate surface by spreading the depletion layer further out towards the edge of the substrate 6, past further guard rings 10 at successively lower potentials, until the high charge density present in the active area 3 is tapered to zero across the termination area 4. Field plates 11 serve to distribute the potential yet more evenly near the surface, thereby avoiding concentrations of potential lines ("crowding").

Figure 2:
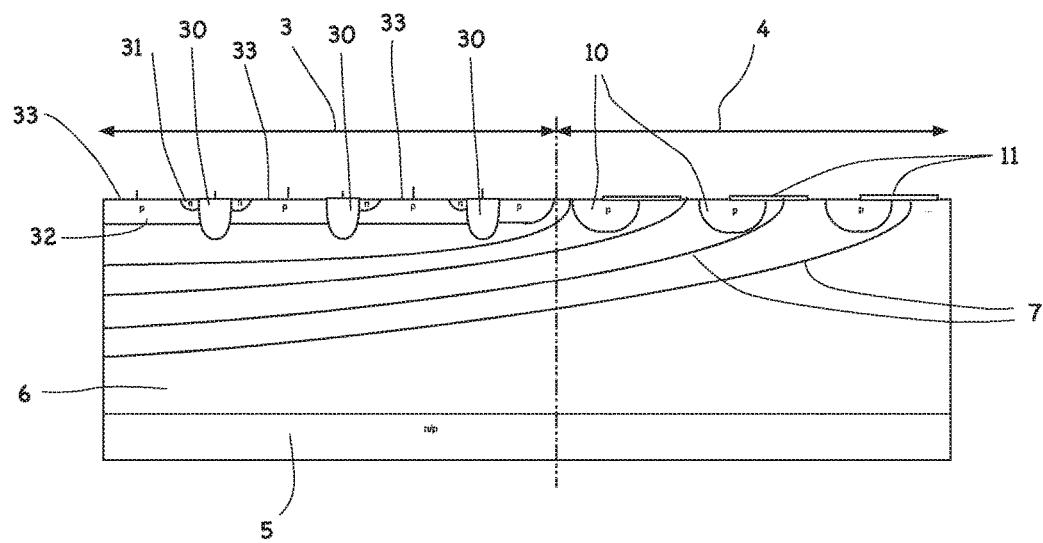
FIG. 2 shows, in schematic, cross-section view, an example of a trench-gated n-channel device terminated using p-rings and field plates, as known in the prior art.

FIG. 2 shows a cross-sectional view of an n-channel trench gated MOSFET or IGBT. As in the device shown in FIG. 1, the active cell area 3 of the device is extended by a termination area 4 of the substrate 6. The termination area 4 uses surface p-rings (guard rings) 10, which partially replace the drift layer material 6 at and near the surface of the termination area 4. Field plates 11 are also added to the edge of each of the p-rings 10. As with the example device of FIG. 1, the guard rings 10 and field plates 11 serve to deflect the potential lines 7 and prevent a concentration of potential lines in the surface region of the termination area 4.

Figure 3:
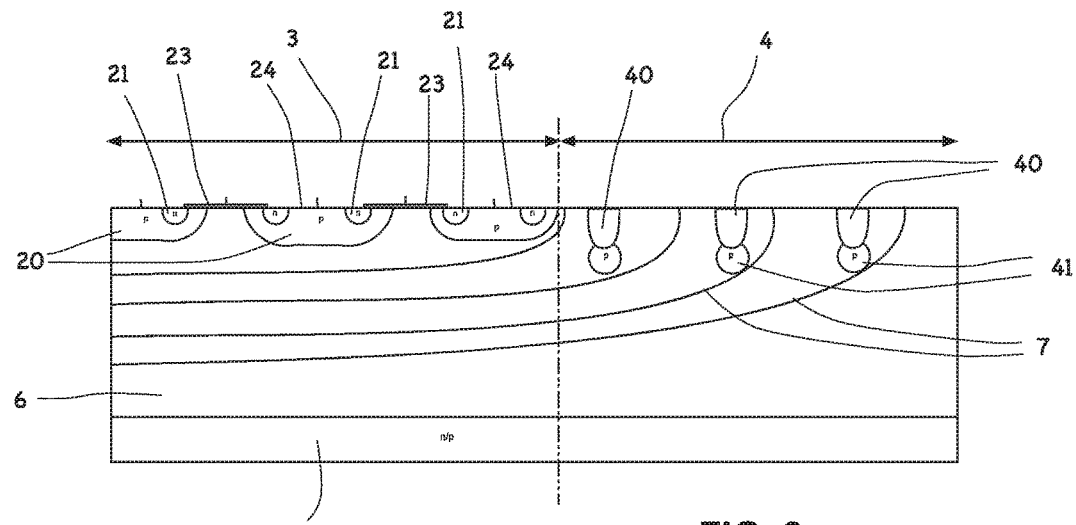
FIG. 3 shows, in schematic, cross-section view, an example of an n-channel DMOS device terminated using trenches and buried p-rings, as known in the prior art.
Figure 4:
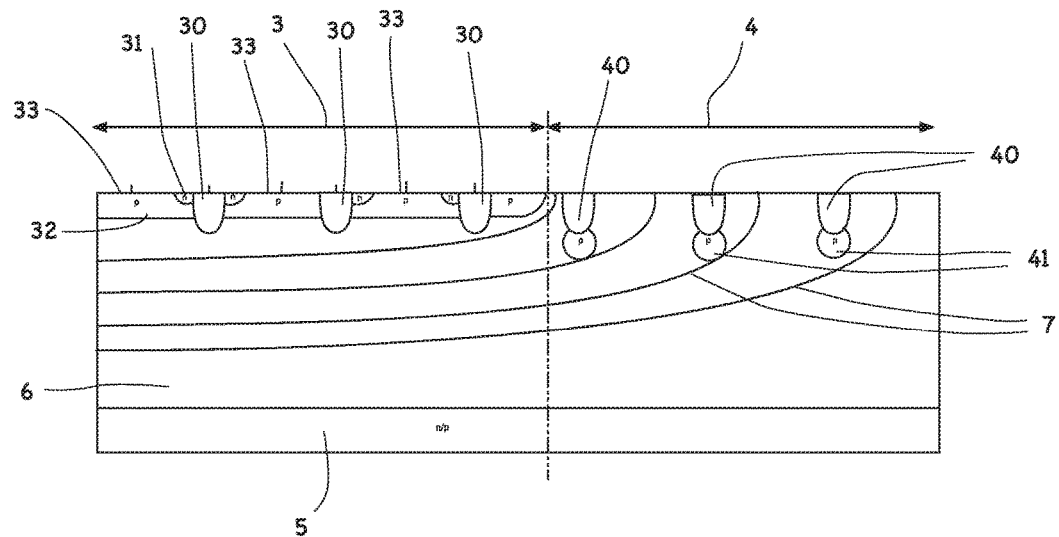
FIG. 4 shows, in schematic, cross-section view, an example of a trench-gated n-channel device terminated using trenches and buried p-rings, as known in the prior art.

FIGS. 3 and 4 show similar devices to those depicted in FIGS. 1 and 2 respectively, but terminated with termination trenches 40 instead of the surface p-rings 10 of FIGS. 1 and 2. Each of the termination trenches 40 may be filled with a dielectric material such as a silicon oxide, or a conductive material such as polysilicon. A p-doped region 41 may be formed at or near the end or tip of each termination trench 40, to provide enhanced deflection of the potential lines around the end of the termination trench 40. The deep p-doped regions 41, also referred to as deep or buried guard rings 41, are known to be an effective alternative to the surface guard rings 10 described with reference to FIGS. 1 and 2.

Note that the devices described with reference to FIGS. 1 to 4 are depletion mode devices, in which a dedicated p-n junction depletes in the off-state so as to withstand the off-state voltage. In other words, the depleted region electrically isolates the p-doped region and the n-doped region from one another.

Figure 5:
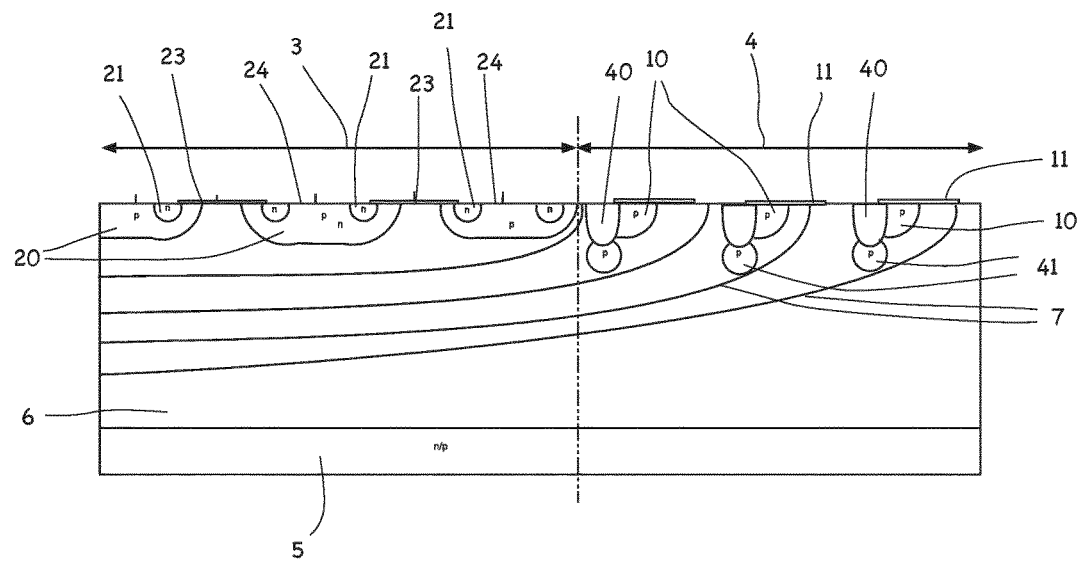
FIG. 5 shows, in schematic, cross-section view, an example of an n-channel DMOS device terminated using trenches, buried guard rings and surface guard rings in accordance with the invention.

FIG. 5 shows a first embodiment of an inventive MOSFET. the lightly n-doped region 6 part may be referred to as the "drift region", the "lightly-doped region" or the "reverse voltage supporting region". For a power device made by starting with a substrate of low n– doping concentration, the drift layer 6 in the finalized power device shall be the layer of unamended doping concentration by manufacturing steps. Exemplarily, the drift layer 6 has a constantly low doping concentration. Therein, the substantially constant doping concentration of the drift layer 6 means that the doping concentration is substantially homogeneous throughout the drift layer 6, however without excluding that fluctuations in the doping concentration within the drift layer being in the order of a factor of one to five may be possibly present due to e.g. a fluctuations in the epitaxial growth process. The final drift layer thickness and doping concentration is chosen due to the application needs. An exemplary doping concentration of the drift layer 6 is between $5*10^{12}$ cm$^{-3}$ and $5*10^{14}$ cm$^{-3}$.

However, the implementation of the invention is not limited to such devices; other possibilities include, for example, its use in superjunction (SJ) or other types of device which require terminating. In an SJ device, the drift region may typically be replaced by alternating highly doped p and n layers which, under mutual charge compensation, can completely deplete in the off-state and support a high voltage across the device.

Similarly, while the figures show one particular doping scheme (eg n-channel MOSFETS), it would of course be possible to use different (eg reversed) doping schemes.

Figure 6:
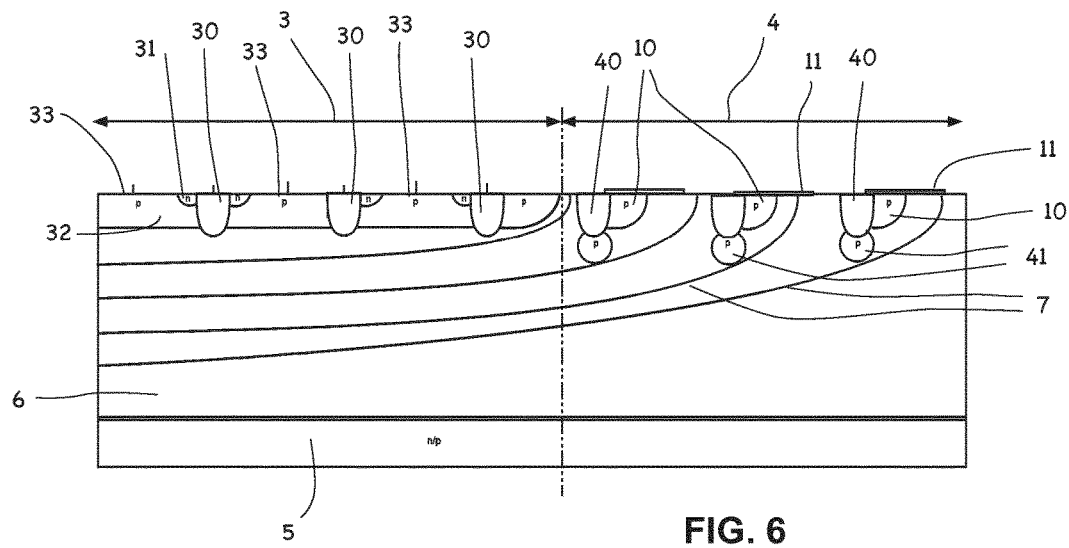
FIG. 6 shows, in schematic, cross-section view, an example of a trench-gated n-channel device terminated using trenches, buried guard rings and surface guard rings in accordance with the invention.

FIGS. 5 and 6 illustrate an example of a termination arrangement which makes use of the principles of the present invention. The active areas 3 of the devices depicted in FIGS. 5 and 6 correspond to the active areas of FIGS. 1 and 2, or 3 and 4, respectively. The substrate 6 comprises an (n–) doped drift layer. In the active cell area, the device comprises main electrical contacts on a first and second main side on opposing sides of the substrate. The substrate 6 comprises an active cell area 3, which is surrounded laterally (i.e. in a plane parallel the main sides) by a termination area 4, which extends to the edge of the substrate (lateral surface sides of the substrate).

In the termination areas 4, by contrast, the devices shown in FIGS. 5 and 6 combine the principles of termination trenches 40 with buried guard rings 41, and a variant of the surface guard rings 10, wherein the guard rings have a different conductivity type than the drift layer, in this example the guard rings are p doped. In both of the example devices shown in FIGS. 5 and 6, the termination area 4 comprises termination trenches 40 and buried guard rings 41 which provide a primary termination effect by guiding the potential lines 7 laterally outward from the active area 3. Each termination trench 40 also has an outer adjacent surface guard ring 10, abutting the outward side of the termination trench 40, to guide the potential lines 7, which would otherwise curve around the termination trenches as indicated in FIGS. 3 and 4, and may form local crowding of potential lines 7 near the outer side of each termination trench 40, to spread them further outward and away from the termination trench 40. Thus, the presence of p-doped buried guard rings 41 under the termination trenches 40 releases part of the electric field deeper into the device silicon, hence the breakdown voltage is increased. The termination trenches 40 may be filled with oxide or polysilicon, for example. The surface of the termination area 4 adjacent to each termination trench 40 is kept protected from high electric fields by aligning surface p-rings 10 with the outer side of the termination trenches 40. The surface may be further protected by forming field plates (eg of dielectric oxide) at the edge of each surface p-ring (10).

The termination trenches 40, with their buried p-rings 41, and the surface p-rings 10 (rings of the second conductivity type), may be fabricated in self-aligning fashion. An n-doped substrate 6 may be provided. For example, the surface p-rings 10 may be formed first (eg by implantation and diffusion) in the substrate 6, and then the termination trenches 40 may be etched or otherwise formed such that the outward edge of one of the termination trenches (edge outwards from the active cell area 3, i.e. towards the substrate edge) intersects with an inward part (towards the active cell area 3) of its abutting surface p-ring. The termination trenches 40 may be formed in conventional fashion by removing the substrate material. Once the termination trenches 40 have been opened, then the buried p-rings 41 may be formed under the termination trenches 40 by implantation (doping) the substrate body in the region 41 adjacent to the bottom of each termination trench 40. Advantageously, the number of process steps and/or masks required may be reduced by forming the surface p-rings 10 in the termination area 4 and the p-well bodies 20 or body 32 using the same mask and the same doping process. Thus, for the example device illustrated in FIG. 5, the fabrication process may advantageously be configured such that the same mask and process is used not only for the surface p-rings 10 in the termination area 4, but also the device cell body (p-well) regions 20 in the active area. For the example device illustrated in FIG. 6, the fabrication process may advantageously be configured such that the same mask and/or process is used not only for the termination trenches 40 in the termination area 4, but also for the device cell trench-gates 30 of the device cells in the active area 3. Additionally, in the fabrication process for the example device shown in FIG. 6, a single mask and/or process may advantageously be used for forming the surface p-rings 10 in the termination area 4 and the p-body layer 32 in the active area 3.

Surface field plates 11 may also be formed, partially or fully covering each termination trench 40 and its abutting surface guard-ring 10, and extending outward beyond the surface guard-ring 10 over the surface of the drift region 6 (n− doped region, i.e. of a second conductivity type, which conductivity type is different than the first conductivity type) which separates the termination trenches 40. The electric field distribution over the termination area 4 may be controlled by suitable choice of the dimensions and spacing of termination trenches 40, surface p-rings 10 and buried p-rings 41.

Figure 7:
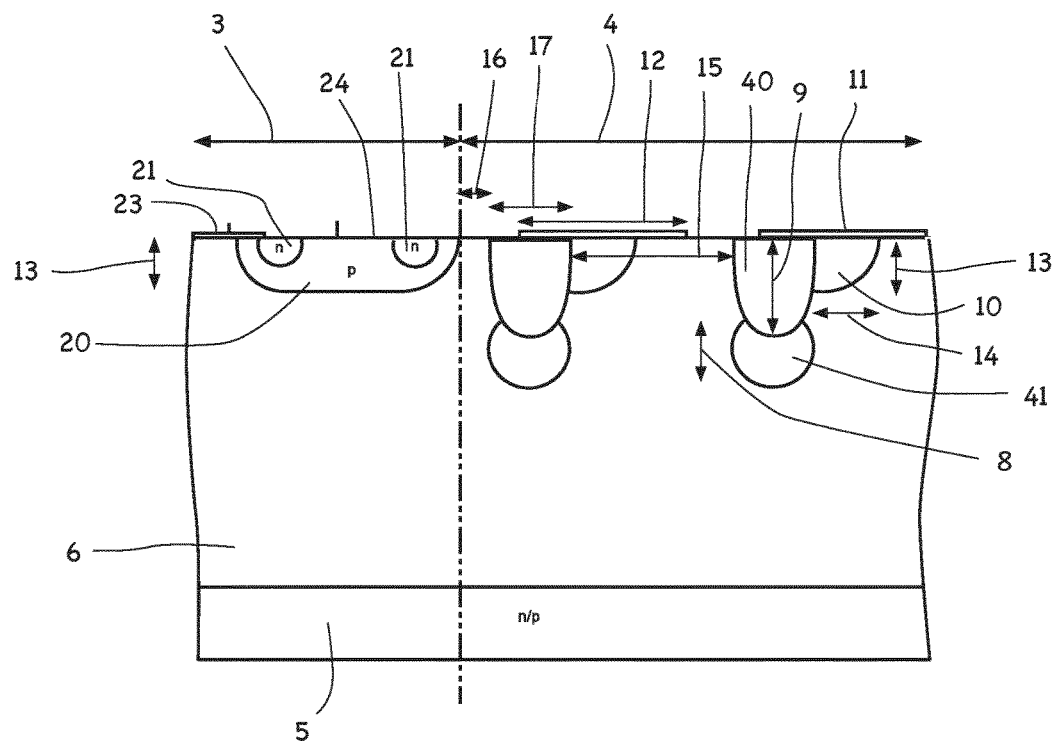
FIG. 7 shows, in schematic, cross-section view, an example of an n-channel DMOS device terminated using trenches, buried guard rings and surface guard rings in accordance with the invention.

FIG. 7 shows an example of some dimensions of the termination trenches 40, buried p-rings 41, surface p-rings 10 and field plates 11. Although only two termination trenches 40 are illustrated in FIG. 7, it should be understood that this number may in practice be significantly greater— for example as many as 15 or 20 or more, distributed across the termination area 4.

By way of example, the distance 16 between the edge of the active area 3 and the first termination trench 40 may be between 5 µm to 10 µm (eg 7 µm), for example. The mesa width 15 (ie the separation distance between adjacent termination trenches 40) may for example be 7-20 µm, and may increase in the direction away from the active area 3. The trench depth 9 may be between 4 and 7 µm (eg 5.2 µm), the trench width 17 may be between the minimum permitted by the fabrication process and 4 µm, for example (eg 1.2 µm). The peak doping concentration of the buried p-rings 41 may be between $10^{16}$ cm$^{-3}$ and $10^{18}$ cm$^{-3}$ (eg $10^{17}$ cm$^{-3}$), and a doping concentration at a doping depth of 2 µm may be between $10^{15}$ cm$^{-3}$ and $10^{16}$ cm$^{-3}$ (eg $5\times10^{15}$ cm$^{-3}$). The height 8 of the deep p-ring (buried guard ring) 41 may be between 2 and 5 µm (eg 3-4 µm). The lateral extent of the surface p-rings (guard rings) 10 may be between 1 and 5 µm, and preferably between 1 and 2 µm—eg 1.5 µm, while the vertical extent (depth) of the surface p-rings (guard rings) 10 is preferably substantially the same as the depth of the p-wells (body region) 20 of the device cells in the active area 3. Similarly, the doping concentration of the surface p-rings (guard rings) 10 is preferably substantially the same as that of the p-wells 20 of the device cells in the active area 3. For devices with these preferred dimensions, the field plate width 12 may be between 3 and 8 µm, for example, or more preferably between 4 and 6 µm (eg 4.5 µm). The guard-rings/trench/field-plates termination may be made using standard device processing techniques such as implantation, diffusion, etch and refill. The dimensions and distances of the surface 10 and deep 41 guard rings, the field plates 11 and the oxide/polysilicon filled trenches 40 can be varied to suit the required reverse breakdown voltage.

The combination of the surface and deep ring termination, the dielectric/trench termination and the field plates offers a significant area reduction in the termination area required the effective junction termination of high-voltage devices which may be required to withstand reverse voltage of 5 kV, 6 kV or more. At lower voltages (eg 1.3 kV), the termination described here has been found to offer a reduction of 30% or more in the minimum radial extent of the termination area.

Figure 8:
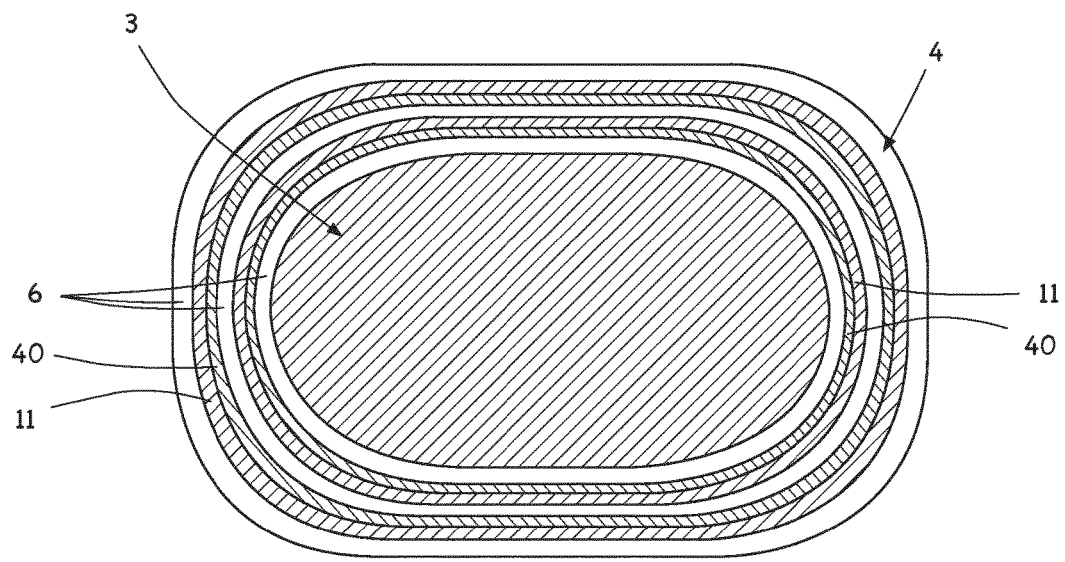
FIG. 8 shows, in schematic, plan view, an example of a generic device terminated in accordance with the invention.

FIG. 8 shows a schematic plan view of a simplified example of a termination area comprising termination trenches 40 and field plates 11. Not visible are the surface guard rings 10 (obscured by the field plate 11) and the buried guard rings 41 (under the termination trenches 40). In a real implementation of the termination arrangements described above, the number of termination structures (termination trench 40, buried guard-ring 41, surface guard-ring 10 and field plate 11) would be significantly greater than the two shown in FIG. 8.

The invention claimed is:
1. A method of fabricating a semiconductor power device, wherein the semiconductor power device comprises a semiconductor substrate having an active cell area, which comprises a drift layer of a first conductivity type, and an edge termination area up to a substrate edge, and wherein the method comprises:
    (a) forming a plurality of surface guard rings of a second conductivity type different from the first conductivity type, which are separated from each other, in the surface of the edge termination area,

(b) removing substrate material so as to form a plurality of termination trenches extending down from the surface of the edge termination area, such that each surface guard ring abuts an adjacent termination trench only on a side towards the substrate edge and the drift layer abuts said termination trench on a side towards the active cell area such that the drift layer separates the termination trenches, (c) forming a buried guard ring of the second conductivity type in the substrate material adjacent to the bottom of each termination trench, and (d) filling each termination trench with a dielectric material or a conductive material.

2. The method according to claim 1, which further comprises step (e) of, for each termination trench, forming a field plate over a part of a termination trench and its abutting surface guard ring.

3. The method according to claim 1, which further comprises step (e), forming a field plate, which extends on a side towards the substrate edge beyond the surface guard ring over the surface of the drift layer.

4. The method according to claim 1, wherein step (a) is performed before the step (b) such that, for each of the plurality of termination trenches, the substrate material removed in the step (b) includes a portion of one of the surface guard rings.

5. The method according to claim 1, wherein the active cell area comprises a plurality of trench-gate device cells, and wherein the step (b) comprises forming trenches of the trench-gate device cells during the same fabrication process or processes as the termination trenches.

6. The method according to claim 1, wherein the active cell area comprises a plurality of active device cells, each comprising a body region, and wherein the step (a) comprises forming the body regions of the active device cells during the same fabrication process or processes as the surface guard rings.

7. The method according to claim 5, which further comprises step (e), for each termination trench, forming a field plate over a part of a termination trench and its abutting surface guard ring and wherein each active device cell comprises at least one of a gate connection and a power connection, and wherein the step (e) comprises forming the gate connection and/or power connection during the same fabrication process or processes as the field plate.

8. The method according to claim 5, which further comprises step (e), for each termination trench, forming a field plate over a part of a termination trench, its abutting surface guard ring and extends on a side towards the substrate edge beyond the surface guard ring over the surface of the drift layer and wherein each active device cell comprises at least one of a gate connection and a power connection, and wherein the step (e) comprises forming at least one the gate connection and the power connection during the same fabrication process or processes as the field plate.

9. The method according to claim 6, which further comprises step (e), for each termination trench, forming a field plate over a part of a termination trench and its abutting surface guard ring and wherein each active device cell comprises at least one of a gate connection and a power connection, and wherein the fifth step comprises forming the gate connection and/or power connection during the same fabrication process or processes as the field plate.

10. The method according to claim 6, which further comprises step (e), for each termination trench, forming a field plate over a part of a termination trench, its abutting surface guard ring and extends on a side towards the substrate edge beyond the surface guard ring over the surface of the drift layer and wherein each active device cell comprises at least one of a gate connection and a power connection, and wherein the step (e) comprises forming at least one the gate connection and the power connection during the same fabrication process or processes as the field plate.

11. A semiconductor power device comprising a semiconductor substrate, which has an active cell area, which comprises a drift layer of a first conductivity type, and an edge termination area up to a substrate edge, wherein the edge termination area comprises:

a plurality of surface guard rings of a second conductivity type different from the first conductivity type, which are separated from each other, disposed in the surface of the substrate, a plurality of termination trenches extending down from the surface of the substrate and filled with a dielectric material or a conductive material, such that each surface guard ring abuts an adjacent termination trench only on a side towards the substrate edge and the drift layer abuts said termination trench on a side towards the active cell area such that the drift layer separates the termination trenches, and a plurality of buried guard rings, each buried guard ring being disposed in the substrate adjacent to a bottom of one of the termination trenches.

12. A semiconductor power device according to claim 11, wherein at least one field plate is disposed over a part of a termination trench and its abutting surface guard ring.

13. A semiconductor power device according to claim 12, wherein the at least one field plate extends on a side towards the substrate edge beyond the surface guard ring over the surface of the drift layer.

14. A semiconductor power device according to claim 11, wherein the active cell area comprises a plurality of trench-gate device cells, and wherein the termination trenches are filled with the same material as the trench-gate trenches of the trench-gate devices.

15. A semiconductor power device according to claim 11, wherein the active cell area comprises a plurality of active device cells, each comprising a body region of the second conductivity type, and wherein the surface guard rings has the same doping concentration profile as the body regions of the active device cells.

16. A semiconductor power device according to claim 15, wherein at least one field plate is disposed over a part of a termination trench and its abutting surface guard ring and wherein each active device cell comprises at least one of a gate connection and a power connection, and wherein the termination trenches and surface guard ring field plates comprise the same material as the at least one of a gate connection and power connection of the active device cells.

17. A semiconductor power device according to claim 16, wherein the at least one field plate extends on a side towards the substrate edge beyond the surface guard ring over the surface of the drift layer.

* * * * *